United States Patent [19]

Hashimoto

[11] Patent Number: 5,689,467
[45] Date of Patent: Nov. 18, 1997

[54] APPARATUS AND METHOD FOR REDUCING TEST TIME OF THE DATA RETENTION PARAMETER IN A DYNAMIC RANDOM ACCESS MEMORY

[75] Inventor: Masashi Hashimoto, Tsukuba, Japan

[73] Assignee: Texas Instruments Incorporated, Dallas, Tex.

[21] Appl. No.: 565,495

[22] Filed: Nov. 30, 1995

[51] Int. Cl.⁶ .................................................. G11C 29/00
[52] U.S. Cl. ........................ 365/201; 365/190; 365/205; 365/189.09; 365/222; 365/228; 365/203
[58] Field of Search ............................ 365/201, 190, 365/205, 189.09, 222, 228, 203

[56] References Cited

U.S. PATENT DOCUMENTS

| 5,339,277 | 8/1994 | McClure | 365/230.08 |
| 5,341,336 | 8/1994 | McClure | 365/201 |

OTHER PUBLICATIONS

Richard C. Foss, Senior Member, IEEE, and Robert Harland, "Peripheral Circuits for One–Transistor Cell MOS RAM'S" J. Solid State Circuits vol. SC–10. pp. 255–261, Oct. 1975.

Masashi Hashimoto, Isao Uchida, and Seishi Hatakoshi, "Over an Order of Magnitude DRAM Test Time Reduction" (To be published).

Primary Examiner—David C. Nelms
Assistant Examiner—Andrew Q. Tran
Attorney, Agent, or Firm—William W. Holloway; W. James Brady, III; Richard L. Donaldson

[57] ABSTRACT

In a dynamic random access memory device, the time required for implementation of memory cell data retention time testing procedures can be reduced by changing the voltage level(s) applied to the components of the storage cell when compared to the voltages applied during the typical memory cell operation. By changing the voltage(s) applied to the components, the difference in the bitlines detected by the sense amplifier will be reduced. Because to the reduced bitline voltage difference, the decay of the charge on the storage cell causes a reduction in the data retention time. The data retention time is reduced in manner related to the typical memory cell operation. The altered voltage(s) can be applied to the storage cell bitlines and/or to the storage cell dummy capacitances.

9 Claims, 2 Drawing Sheets

APPARATUS AND METHOD FOR REDUCING TEST TIME OF THE DATA RETENTION PARAMETER IN A DYNAMIC RANDOM ACCESS MEMORY

BACKGROUND OF THE INVENTION

1. Field of the Invention

This invention relates generally to integrated circuit dynamic random access memory (DRAM) devices and, more particularly, to the testing of these memory units. Apparatus and an associated technique reduce the time to perform the testing procedure identifying the data retention time parameter.

2. Description of the Related Art

As the number of storage cells in each integrated circuit memory array device has increased, the time required to test these devices has similarly increased. Because of the enormous number of storage cells, the testing procedure has threatened to become a limiting factor in the fabrication of these devices. In order to expedite the testing procedure and to reduce the dependence on dedicated testing apparatus, apparatus for performing at least a portion of the testing function is being added as an integral part of the memory device substrate. Even with this additional circuitry, the testing procedure, in view of the ever increasing number of storage cells, poses a continuing problem in the testing of these memory devices.

One of the most time-consuming test procedures involving the storage cell is the verification of the data retention time parameter. In the DRAM devices, a logic state, typically the "1" logic state is determined by the amount of charge found on a storage cell capacitor when the storage cell is accessed or "read" by associated apparatus. However, because of physical processes such a leakage of charge to the substrate, the amount of charge stored on the storage capacitor is continuously being reduced. Thus, after a time, the amount of charge on the storage cell capacitor will be reduced to an amount where, upon access to the storage cell, a incorrect identification of the logic state is made. The parameter identifying this deterioration of the amount of charge is the data retention time parameter. In practice, this parameter determines the refresh rate, i.e., the rate at which the charge on the storage cell capacitor must be renewed to provide an unambiguous "1" logic state identification.

Referring to FIG. 1, the basic components of the a storage cell and related apparatus are shown. Bitline conductor 1 is coupled to a first terminal of a sense amplifier, to first source-drain path terminal of n-channel field effect transistor 14, to a first source-drain path terminal of n-channel field effect transistor 15, and to a first source-drain terminal of n-channel field effect transistor 17. Bitline_ conductor 2 is coupled to second input terminal of sense amplifier 9, to a second source-drain terminal of transistor 15, and to a first source-drain terminal of n-channel field effect transistor 16. A conductor 3 having the voltage $V_{REF}$ applied thereto by $V_{REF}$ generator unit is coupled to a second source-drain terminal of transistor 16 and to a second source-drain terminal of transistor 17. The gate terminals of transistor 15, transistor 16, and transistor 17 are coupled to a conductor 4 having a PRECHARGE signal applied thereto. A second source-drain terminal of transistor 14 is coupled through the storage cell capacitor 13 to the ground potential. A gate of transistor 14 is coupled to the WORDLINE conductor 5.

A "1" logic state is represented by a charge stored on capacitor 13 when the capacitor has a voltage $V_{cc}$ applied thereto. To determine the logical state stored on the capacitor 13, bitline 1 and bitline_ 2 are charged to a potential equal to $V_{REF}=V_{CC}/2$ in response to a PRECHARGE signal which renders transistor 15, transistor 16 and transistor 17 conducting. The PRECHARGE signal is removed, thereby storing charge on the bitline 1 and the bitline_ 2. A signal on the WORDLINE conductor 5 causes transistor 14 to become conducting. As a consequence, the charge from storage cell capacitor 13 is applied to bitline 1, thereby providing a voltage difference between the bitline 1 and the bitline_ 2. This voltage difference is given by the expression:

$$V_{BITLINE} - V_{BITLINE\_} = \{V_{CC}/2\}\{1/(1+C_B/C_S)\} \qquad (1)$$

where $C_B$ is the capacitance of the bitline, and $C_S$ is the capacitance of storage cell capacitor 13.

This voltage difference is applied to the sense amplifier 9 which amplifies the difference signal to provide a logic level output signal. The voltage difference can be of the order of magnitude of 150 millivolts.

As indicated above, the charge on the storage cell capacitor can be lost over time. Referring to FIG. 2, a graph of charge on the storage capacitor as a function of time is shown. The amount of charge needed to identify the charge on the storage cell capacitor as "1" data signal during a storage cell access is indicated on the graph. A data retention time of $t_{TEST}$ is required for successful operation of the cell as designed. For a good storage cell, i.e., a storage cell that provides for satisfactory operation of the storage cell, the logic "1" state will be correctly identified until time $t_2$ which is greater than $t_{TEST}$. A bad storage cell will provide an incorrect identification of the logic state at $t_{TEST}$, the charge on the storage cell capacitor having fallen below the detectable voltage level at $t_1$ (which is less than $t_{TEST}$. In general, the time $t_{TEST}$ will be longer than the period between refresh operations on the storage cell.

In general to determine whether a cell will provide satisfactory operation, the access of the cell must occur only at time $t_{TEST}$. Therefore, time $t_{TEST}$ becomes a limitation which causes the data retention time parameter measurement to place an excessive time burden on the testing procedures. Attempts to expedite this parameter determination have heretofore been unsatisfactory. For example, the temperature of the device can be raised, thereby accelerating the deterioration of the charge on the storage cell in a predicable manner. However, the change in temperature also effects the associated circuitry and can compromise the usefulness of the testing procedure.

A need has therefore been felt for apparatus and an associated technique for reducing the time to test for the storage cell data retention time parameter which is not complicated by an interdependence with other parameters.

SUMMARY OF THE INVENTION

The aforementioned and other features are accomplished, according to the present invention, by altering the difference voltage between a bitline pair sensed by the sense amplifier. By decreasing the voltage difference between bitlines, the decay of charge on the storage cell capacitor will more rapidly reach the value where the "1" logic state can not be detected than occurs when the typical bitline pair voltage difference is present. The reduction in the data retention time, in combination with the fact that the data retention time for the reduced voltage levels can be directly related to the data retention time for the typical operating voltage levels, permits the time for test procedures to be greatly reduced. The components for which the applied voltage can be altered in this testing procedure include the storage cell capacitors, the bitlines and the dummy storage cell capacitors as well as combination of these components.

These and other features of the present invention will be understood upon the reading of the Specification in conjunction with the Figures.

DESCRIPTION OF THE PREFERRED EMBODIMENT(S)

Figure 1:
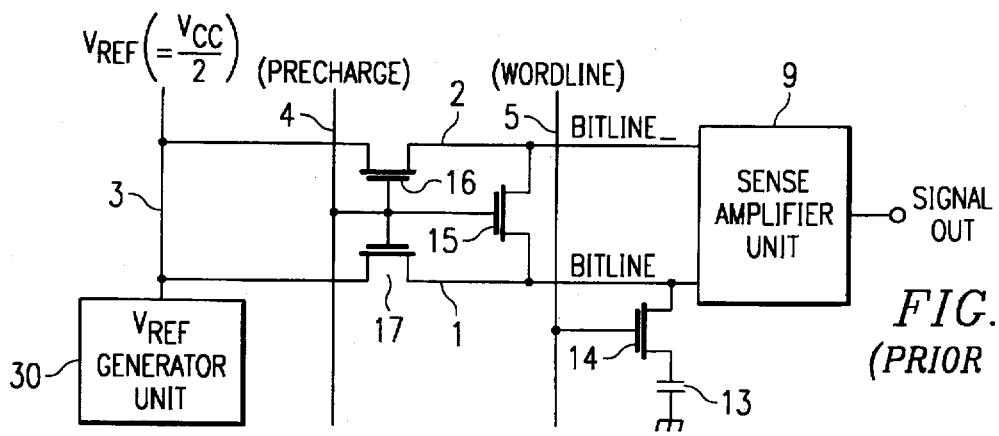
FIG. 1 is a schematic diagram of a typical storage cell capacitor and associated apparatus.
Figure 2:
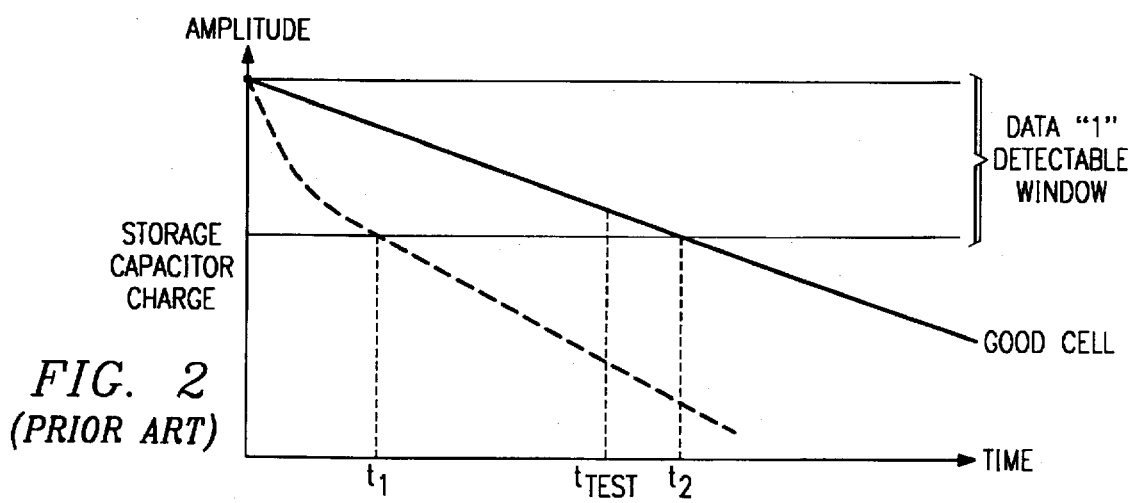
FIG. 2 is graph illustrating the difference, as a function of time, between a useable storage cell and an unusable storage cell.

1. Detailed Description of the Drawings FIGS. 1 and FIG. 2 have been described with respect to the prior art.

Figure 3:
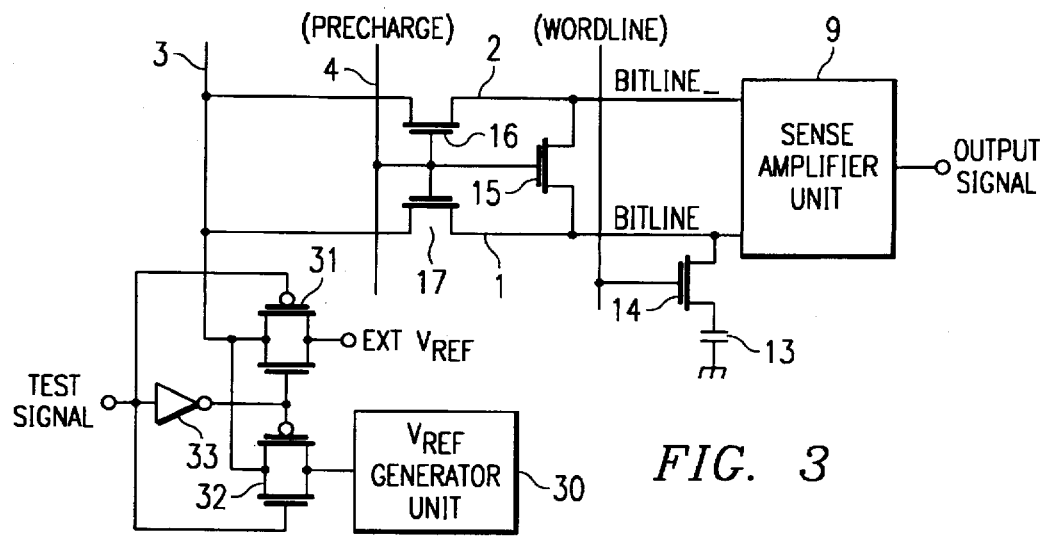
FIG. 3 is a schematic diagram of the apparatus for providing an expedited data retention time parameter measurement of the apparatus of FIG. 1 according to the present invention.

Referring to FIG. 3, the apparatus for expedited measurement of a data retention time parameter according to the present invention is shown. In addition to the components described with respect to FIG. 1, the storage cell and related apparatus includes a pass-gate 32 through which the output of $V_{REF}$ generator unit 30 is coupled to $V_{REF}$ conductor 3. An external $V_{REF}$ terminal is coupled to $V_{REF}$ conductor 3 through pass-gate 31. Either the $V_{REF}$ generator unit 30 or the external $V_{REF}$ input signal are coupled to the $V_{REF}$ conductor, depending on the state of a TEST signal which is applied to the p-channel gate terminal of pass-gate 31 and to the n-channel gate terminal of pass-gate 32 and which is applied through inverting amplifier 33 to an n-channel gate terminal of pass-gate 31 and to a p-channel gate terminal of pass-gate 32. The state of the TEST signal determines whether the external $V_{REF}$ signal or the signal from the $V_{REF}$ generator 30 is applied to and charges the bitline pair. The apparatus is thus similar to that of FIG. 1 with the exception that, instead of providing a bitline and bitline__ voltage of $V_{CC}/2$ from the $V_{REF}$ generator 30, i.e., one half the voltage across the storage cell capacitor, the bitline and the bitline__ conductors have a voltage $V_{CC}/2+V_X$ applied thereto from the external $V_{REF}$ during the testing procedures. The bitline and bitline__ voltages, being higher, result in a reduction of the voltage difference between the bitlines when the charged storage cell capacitor is electrically coupled of the bitline 1. because of this reduced voltage difference, the identification of a "1" logic state on the storage cell capacitor will be more sensitive to a loss of charge on the storage cell capacitor. The difference in the bitline voltage resulting from this change in bitline precharge voltage is given by the expression:

$$V_{BITLINE} - V_{BITLINE\_} = \{V_{CC}/2 - V_X\}\{1/(1+C_B/C_S)\} \quad (2)$$

Figure 4:
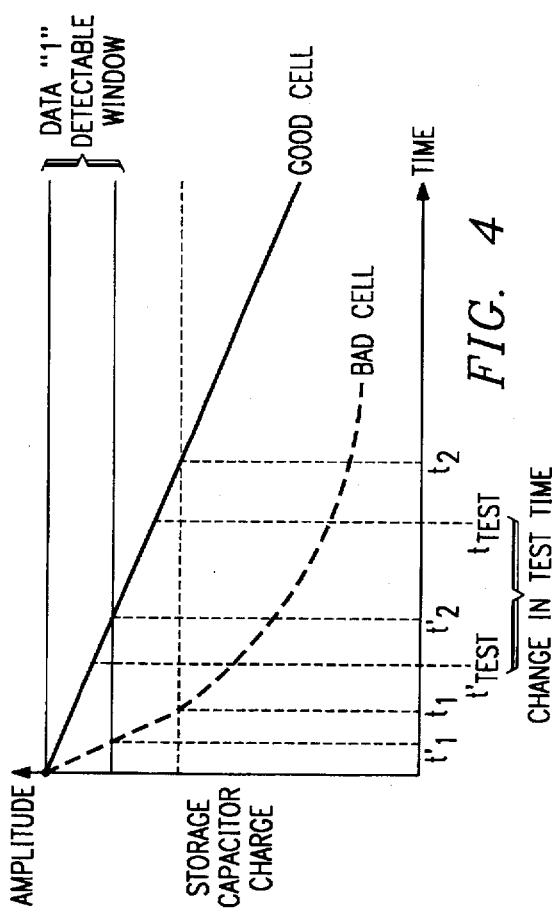
FIG. 4 is a graph illustrating how, by altering a voltage during the test procedure, the data retention time parameter can be verified in an expedited manner.

As illustrated in FIG. 4, the decrease in the bitline voltage pair difference results in an increased sensitivity to the loss of charge on the storage capacitor. As a result of this increased sensitivity is that the time in which a "1" logic state on the storage cell capacitor is decreased both for the good storage cell capacitance and for the bad storage cell capacitance. The time for a good cell to leave the region of correct "1" logic state identification is reduced from $t_2$ to $t'_2$, while the time for a bad cell to leave the region is reduced from $t_1$ to $t'_1$. The time for verification of the data time retention parameter is similarly reduced from $t_{TEST}$ to $t'_{TEST}$.

Figure 5:
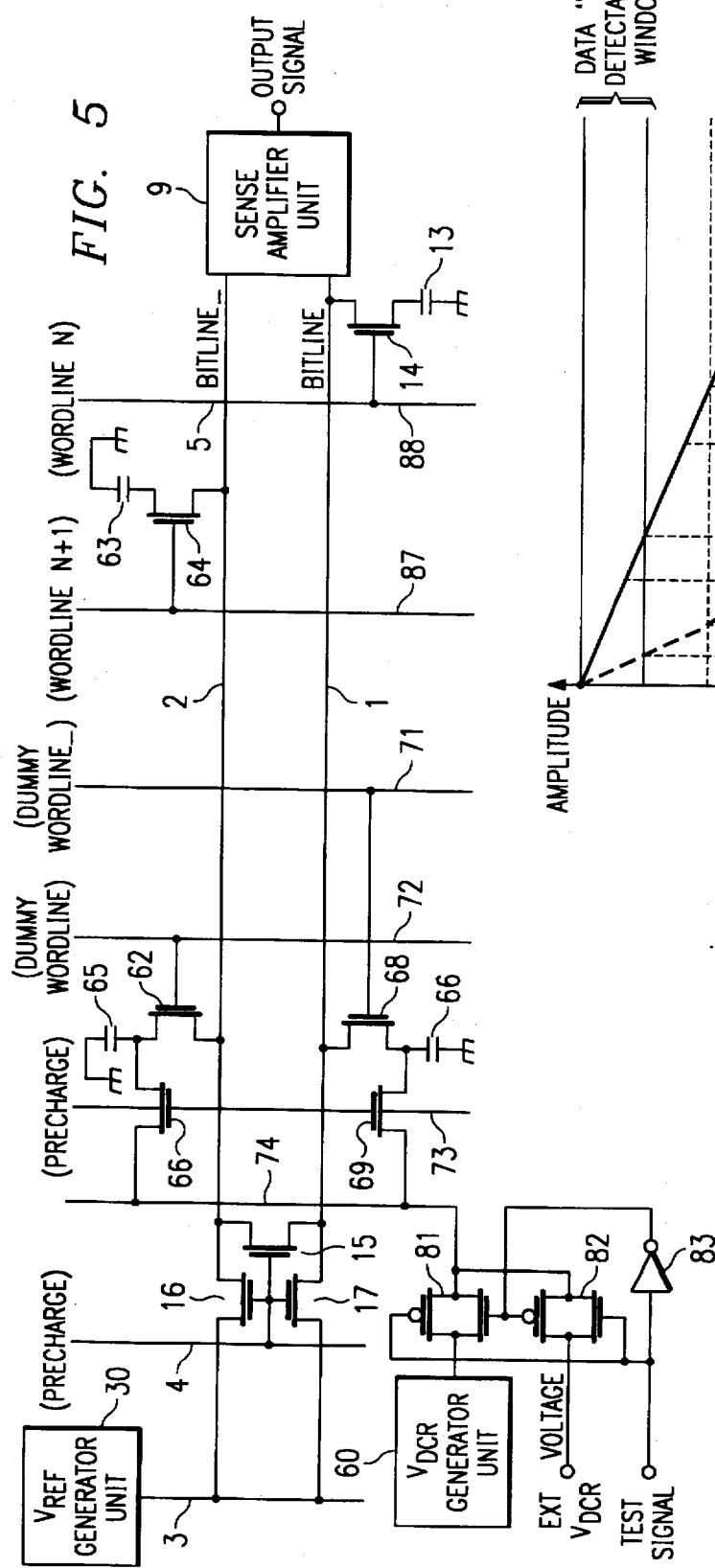
FIG. 5 is a diagram of the apparatus for expedited verification of the data retention time parameter in a storage cell having dummy capacitors by application of an appropriate voltage to the dummy capacitors.

Referring to FIG. 5, a schematic diagram of a memory cell which includes dummy capacitors is shown. The memory cell includes bitline conductor 1, bitline__ conductor 2, $V_{REF}$ generator unit 30, transistors 15, 16, and 17 controlled by PRECHARGE conductor 4, storage capacitor 13 coupled through transistor 14 to bitline 1, WORDLINE conductor 5 coupled to the gate of transistor 14, and sense amplifier unit 9 coupled to the bitline pair similar to the storage cell of FIG. 1. Coupled to the bitline 1 is a first source-drain terminal of the n-channel field effect transistor 68. The second source-drain terminal of transistor 68 is coupled through dummy capacitor 66 to ground potential and is coupled through the source-drain path of n-channel field effect transistor 69 to a $V_{DCR}$ conductor 74. A gate of transistor 68 is coupled to the DUMMY WORDLINE__ conductor 71. An n-channel field effect transistor 62 has first source-drain terminal coupled bitline__ 2. A second source-drain path terminal of transistor 62 is coupled though dummy capacitor 65 to ground potential and is coupled through a source-drain path of n-channel field effect transistor 61 to $V_{DCR}$ conductor 74. A gate terminal of transistor 62 is coupled to DUMMY WORDLINE conductor 72. Gate terminals of transistors 61 and 69 are coupled to PRECHARGE conductor 73. A $V_{DCR}$ generator unit 60 is coupled through pass-gate 81 to the $V_{DCR}$ conductor 74. An external $V_{DCR}$ terminal is coupled through pass-gate 82 to the $V_{DCR}$ conductor 74. A TEST signal is applied to a n-channel control terminal of pass-gate 82 and to a p-channel control terminal of pass-gate 81 and is applied through inverting amplifier 83 to an n-channel control terminal of pass-gate 81 and a p-channel control terminal of pass-gate 82. The difference in bitline pair voltages when the voltage $V_{DCR}$ stored on the dummy capacitor is increased to $V_{DCR}+V_X$ is given by the expression:

$$V_{BITLINE} - V_{BITLINE\_} = (V_{CELL} - V_{DCR} - V_X)\{1/(1+C_B/C_S)\}. \quad (3)$$

where $C_B$ is the capacitance of the bitline, $C_S$ is the capacitance of storage cell capacitor 13, and $C_{DCR}(=C_S)$ is the capacitance of the dummy storage cell capacitor.

Therefore, by increasing the voltage on the dummy capacitor, the difference in the bitline pair voltages is decreased and the determination of the data retention time can be expedited.

2. Operation of the Preferred Embodiment(s)

Referring once again to FIG. 3 and FIG. 5 in each instance, apparatus has been provided which changes, as compared to normal storage cell operation, the voltage on one of the components of the storage cell. Upon access during a read operation to the charge on the storage cell capacitor, the voltage difference as seen by the bitlines and sensed by the sense amplifier is decreased because of the change in the voltage applied to one of the storage cell components. The decrease in the voltage difference between the bitlines makes the read operation more sensitive to the charge stored on the storage cell capacitor. Therefore, less of the charge originally stored on the storage cell capacitor needs to leak away before a stored "1" logic state is no longer detected by the sense amplifier. A shorter time is required, in the presence of a reduced voltage difference between the bitline pair, to provide the data retention time test. The unsatisfactory storage cell will fail in a much shorter time.

Referring once again to FIG. 5 and the configuration in which dummy capacitors are used in a storage cell, it will be clear to those skilled in the art that a second storage cell capacitor 63 with associated transistor 64 and WORDLINE conductor 89 can be present without affecting the operation of the invention. It will further be clear that the internal voltage generator units can be include components responsive to a test signal for providing a second voltage. The voltage generator unit can also be included as part of the sense amplifier.

While the invention has been described with particular reference to the preferred embodiment, it will be understood by those skilled in the art that various changes may be made and equivalents substituted for elements of the preferred embodiment without departing from the invention. For example, while the present invention has been described as altering the voltage on one component in a storage cell during a test procedure as compared to typical read operation, it will be clear that the voltages on more than one component can be varied without departing from the scope of this invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. In a dynamic random access memory having a plurality of storage cells, wherein each storage cell is coupled to one bitline of a bitline pair, a method for reducing the time required to measure the data retention time parameter in a dynamic random access memory unit storage cell, the method comprising the steps of:

applying a first voltage across a storage cell capacitor during operation of said storage cell; and applying a second voltage to said storage cell capacitor during a testing of said storage cell, a difference between said first and said second voltage resulting in reduction of a voltage difference between said bitline pair during detection of signal stored on said storage cell capacitor.

2. A storage cell in a dynamic random access memory, said storage cell comprising:

a sense amplifier;

a first and a second bitline coupled to said sense amplifier, said sense amplifier amplifying a difference in voltage between said first and said second bitline;

a storage cell capacitor for storing a charge;

a switching means for controllably coupling said storage cell capacitor to one of said first and second bitlines; and a voltage generator charging said first and second bitlines to a first potential during an operational mode, said voltage generator charging said first and said second bitlines to a second potential during a test mode.

3. The storage cell of claim 2 wherein said voltage generator is included in said sense amplifier.

4. The storage cell of claim 2 wherein said voltage generator generates said second potential in response to a test signal.

5. The storage cell of claim 2 wherein said voltage generator includes an external voltage, an internal voltage generator and a switch.

6. Apparatus for testing a storage cell comprising:

a sense amplifier unit;

a bitline pair coupled to said sense amplifier unit;

a storage capacitor coupled to a first bitline of said bitline pair; and voltage means for providing a first voltage difference between said bitline pair when said storage capacitor is coupled to said first bitline during a read operation, said voltage means for providing a second voltage difference between said bitline pair when said storage capacitor is coupled to said first bitline during a test procedure.

7. The apparatus of claim 6 wherein said voltage means is included in said sense amplifier unit.

8. The apparatus of claim 6 wherein said voltage means includes an external voltage, a voltage generator and a switch.

9. The apparatus of claim 6 wherein said voltage means includes a voltage generator for producing said second voltage difference in response to a test signal.

* * * * *